(12) United States Patent
Chen et al.

(10) Patent No.: US 11,721,787 B2
(45) Date of Patent: Aug. 8, 2023

(54) METHOD OF MANUFACTURING DISPLAY DEVICE

(71) Applicant: InnoLux Corporation, Miao-Li County (TW)

(72) Inventors: Yi-An Chen, Miao-Li County (TW); Wan-Ling Huang, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/098,419

(22) Filed: Nov. 15, 2020

(65) Prior Publication Data

US 2022/0093819 A1    Mar. 24, 2022

(30) Foreign Application Priority Data

Sep. 23, 2020    (CN) .......................... 202011008889.X

(51) Int. Cl.
*H01L 33/00*    (2010.01)
(52) U.S. Cl.
CPC ...... *H01L 33/0095* (2013.01); *H01L 33/0093* (2020.05)

(58) Field of Classification Search
None
See application file for complete search history.

(56) References Cited

U.S. PATENT DOCUMENTS

| 2016/0013376 | A1* | 1/2016 | Maki | H01L 33/54 |
| | | | | 257/88 |
| 2017/0352646 | A1* | 12/2017 | Bower | H01L 25/0753 |
| 2019/0043843 | A1* | 2/2019 | Liu | H01L 25/0753 |
| 2019/0073578 | A1* | 3/2019 | Lowe | G06K 19/02 |
| 2020/0006178 | A1 | 1/2020 | Huang | |
| 2020/0058834 | A1 | 2/2020 | Park | |

FOREIGN PATENT DOCUMENTS

| JP | 2006-39341 A | 2/2006 |
| JP | 2017-97013 A | 6/2017 |
| TW | 200924229 | 6/2009 |
| WO | 2019/000923 A1 | 1/2019 |

* cited by examiner

*Primary Examiner* — Bradley Smith
(74) *Attorney, Agent, or Firm* — Winston Hsu

(57) ABSTRACT

A method of manufacturing a display device is disclosed. A light emitting unit is provided. The light emitting unit has a chip and at least one bonding pin. The light emitting unit is mounted on the substrate through the at least one bonding pin, and an adhesive material is applied to a space between the chip and the substrate.

5 Claims, 10 Drawing Sheets

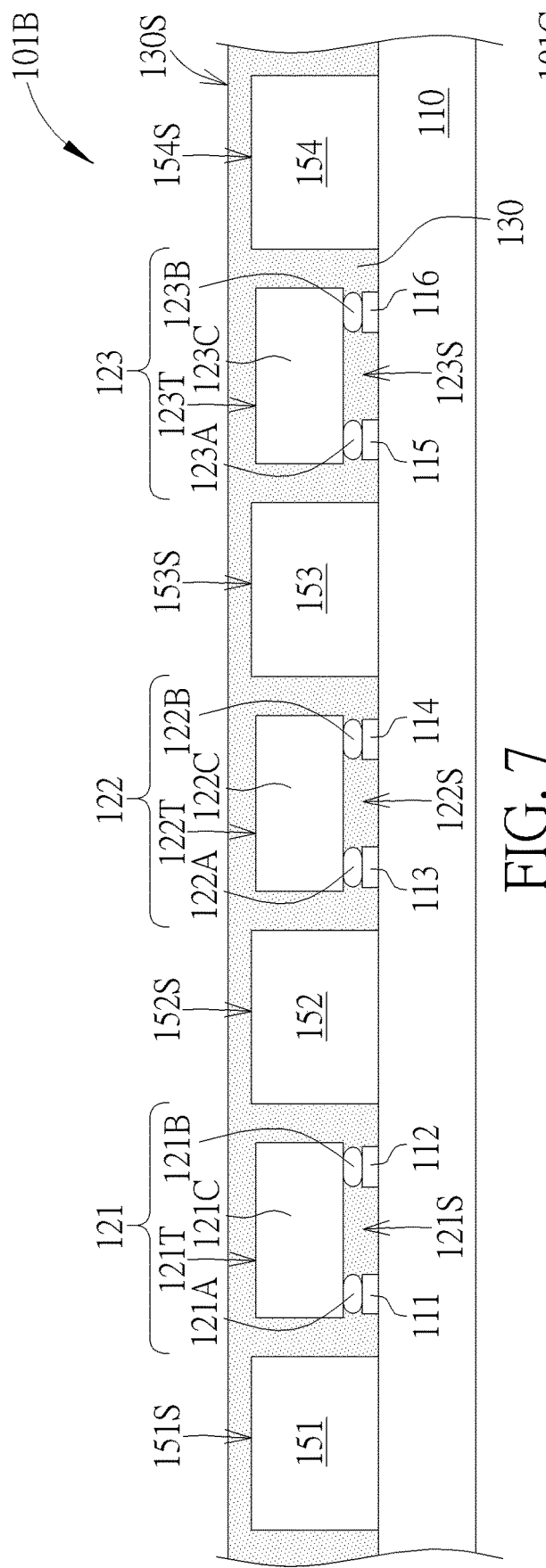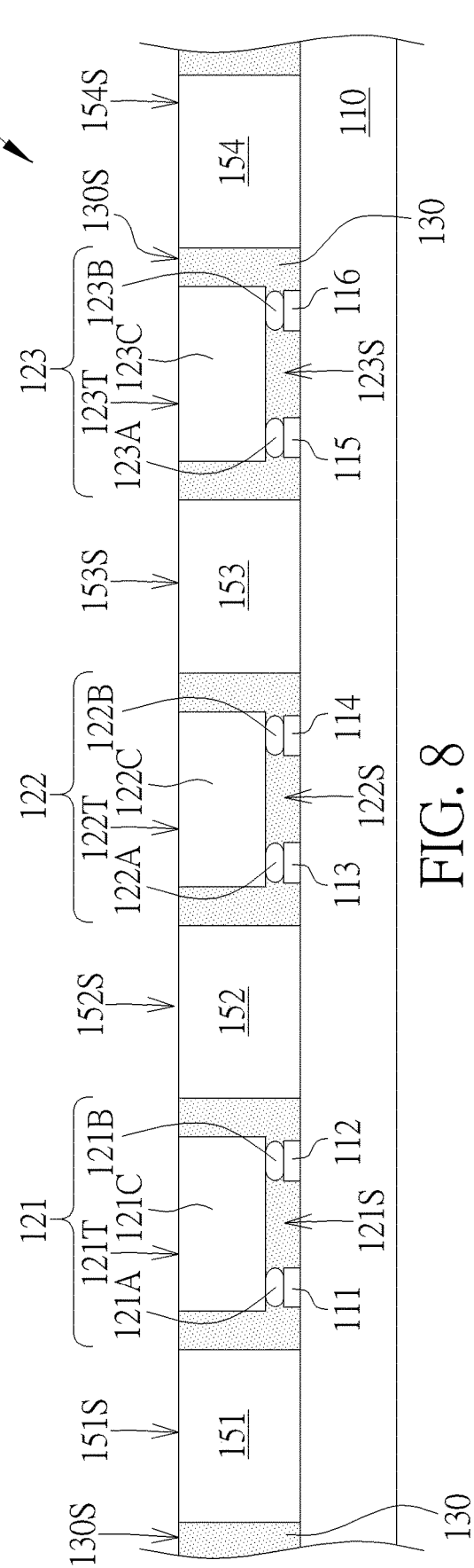

METHOD OF MANUFACTURING DISPLAY DEVICE

BACKGROUND OF THE DISCLOSURE

1. Field of the Disclosure

The present disclosure relates to a method of manufacturing a display device, in particular to a method of manufacturing a display device by applying an adhesive material in the space between a chip and a substrate.

2. Description of the Prior Art

With the development of science and technology and the demand of use, a display device made with micro light-emitting units have gradually become popular in life. In order to increase the yield of the display device, it is one of the important issues for manufacturers to cope with how to develop a display device with greater robustness between the micro light emitting units and the substrate.

SUMMARY OF THE DISCLOSURE

In view of this, it is needed to increase the fabrication yield of the display device to facilitate the innovation of the display device. For example, an improved method may be proposed to strengthen the fixation between the micro light-emitting units and the substrate.

Some embodiments of the present disclosure provide a method of manufacturing a display device. First a substrate is provided; then a light-emitting unit is provided. The light-emitting unit has a chip and at least one bonding pin. The light-emitting unit is mounted on the substrate through the at least one bonding pin. Next, an adhesive material is applied to the space between the chip and the substrate.

According to the embodiments of the method of manufacturing the display device of the present disclosure, by applying the adhesive material in the space between the chip and the substrate, the robustness between the micro light-emitting units and the substrate may be improved. Accordingly, the quality of the micro light-emitting units in the display device may be improved to facilitate the technological development and innovation of the display device.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 5 to FIG. 8 are schematic flowcharts of the second embodiment of the method for manufacturing a display device according to the present disclosure, which show schematic cross-sectional views of the display device.

DETAILED DESCRIPTION

Figure 1:
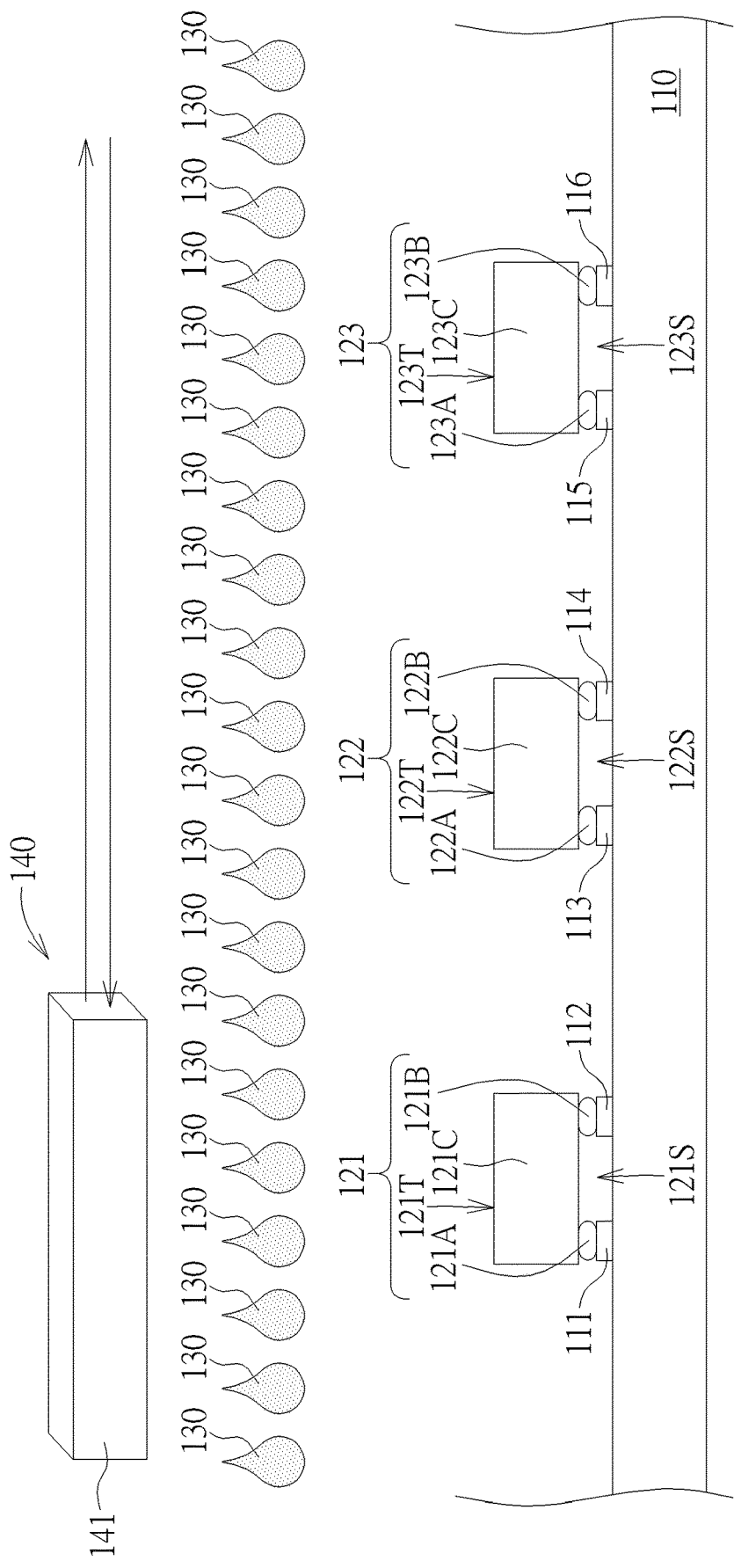
FIG. 1 to FIG. 4 are schematic flowcharts of the first embodiment of the method for manufacturing a display device according to the present disclosure, which show schematic cross-sectional views of the display device.

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When a component or a film layer is referred to as "disposed on another component or another film layer" or "connected to another component or another film layer", it can mean that the component or film layer is directly disposed on another component or film layer, or directly connected to another component or film layer, or there may be other components or film layers in between. In contrast, when a component is said to be "directly disposed on another component or film" or "directly connected to another component or film", there is no component or film between the two. When a component or a film layer is referred to as "coupled to" another component or another film layer, it can mean that the component or film layer is directly connected to another component or film layer, or indirectly connected to another component or film layer via one or more components.

The terms "about", "substantially", "equal", or "$_{same}$" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following may be replaced, recombined, or mixed with one another to constitute another embodiment without departing from the spirit of the present disclosure.

FIG. 1 to FIG. 4 are schematic flowcharts of the first embodiment of the method for manufacturing a display device according to the present disclosure, and show schematic cross-sectional views of the display device. The display device of the present disclosure may be a rigid electronic device, a bendable or flexible electronic device, and/or a tiled device. It should be noted that the electronic device may be any combination of the above, but the present disclosure is not limited thereto. The electronic device may include, for example, a light emitting diode, and the light emitting diode may include, for example, an organic light emitting diode (OLED), a mini light-emitting diode, (mini LED), and a micro LED or quantum dots (QD, for example, QLED, QDLED), fluorescence, phosphor or other suitable materials and the materials may be optionally combined, but the present disclosure is not limited thereto. The embodiments of the present disclosure exemplify a plurality of light-emitting units located on a substrate. The light-emitting unit including micro light-emitting diodes (micro-LED) is taken as an example in the present disclosure, but the present disclosure is not limited thereto.

First, as shown in FIG. 1, a substrate 110 is provided. The substrate 110 may be a transparent or opaque organic material or inorganic material, or a rigid material or a flexible material. The substrate may include, for example, polyimide (PI), polycarbonate (PC), polyethylene terephthalate (PET), other known suitable materials or a combination thereof, but the present disclosure is not limited thereto. The substrate 110 may also be a rigid material, such as glass, sapphire, ceramic or plastic, or any suitable material. Optionally, the substrate 110 may include various elements for use in display devices, such as an array of electronic elements (not shown), wires (not shown), polysilicon (not shown), a bonding pad 111, a bonding pad 112, a bonding pad 113, a bonding pad 114, a bonding pad 115, a bonding pad 116, a source (not shown), a drain (not shown), a common electrode (not shown), a pixel defining layer (not shown) or a limitation layer (not shown), but the present disclosure is not limited thereto.

Next, a plurality of light-emitting units, such as a light-emitting unit 121, a light-emitting unit 122 and a light-emitting unit 123, are provided. FIG. 1 illustrates that there are three light-emitting units disposed on the substrate 110, but the present disclosure is not limited thereto. Each light-emitting unit may have a chip and at least one bonding pin. For example, the light-emitting unit 121 may have a chip 121C and at least one bonding pin. FIG. 1 illustrates an example of a light-emitting unit 121 having two bonding pins (a bonding pin 121A and a bonding pin 121B), but the present disclosure is not limited thereto. Similarly, the light emitting unit 122 may have a chip 122C and two bonding pins, such as a bonding pin 122A/a bonding pin 122B, and the light emitting unit 123 may have a chip 123C and two bonding pins, such as a bonding pin 123A/a bonding pin 123B, but the present disclosure is not limited thereto.

Each of the light-emitting units may be mounted to the substrate 110 through the bonding pin(s). For example, the light emitting unit 121 may be respectively mounted to the corresponding bonding pad 111/bonding pad 112 of the substrate 110 through the bonding pin 121A/bonding pin 121B; the light emitting unit 122 may be respectively mounted to the corresponding bonding pad 113/bonding pad 114 of the substrate 110 through the bonding pin 122A/bonding pin 122B; the light emitting unit 123 may be respectively mounted to the corresponding bonding pad 115/the bonding pad 116 of the substrate 110 through the bonding pin 123A/the bonding pin 123B, but the present disclosure is not limited thereto. The light-emitting unit may be physically and electrically connected to the bonding pads of the substrate 110 through the bonding pins. In some embodiments, the bonding pin(s) of each light-emitting unit and the bonding pad(s) of the substrate 110 may be bonded together through solder, but the present disclosure is not limited thereto. Or, in some embodiments, the bonding pin(s) of each light-emitting unit and the bonding pad(s) of the substrate 110 may be directly bonded together through metal diffusion (such as Cu—Cu bonding), but the present disclosure is not limited thereto.

As the substrate structure shown in FIG. 1, between each chip (for example, the chip 121C of the light-emitting unit 121, the chip 122C of the light-emitting unit 122, or the chip 123C of the light-emitting unit 123) and the substrate 110, there may be a space. For example, a space 121S is disposed between the chip 121C and the substrate 110, a space 122S is disposed between the chip 122C and the substrate 110 or a space 123S is disposed between the chip 123C and the substrate 110, but the present disclosure is not limited thereto. In some embodiments, the spaces between the chips of the light-emitting units and the substrate may not be large. For example, the distance between the chips of the light-emitting units and the substrate is approximately the sum of the height (thickness) of a bonding pad and a bonding pin, and the distance may be less than or equal to 3 micrometers ($\leq 3$ μm), but the present disclosure is not limited thereto. In the current technology, if the space between the chips of the light-emitting units and the substrate is relatively small, it may affect the caulking property of the adhesive material. If the caulking property of the adhesive material is poor, it may be detrimental to the robustness between the light-emitting units and the substrate. The present disclosure provides a method to improve the robustness between the light-emitting units and the substrate, the details are described later.

According to the present disclosure, each light-emitting unit for example may include (but is not limited to) a micro LED. Each micro LED may be used to define a sub-pixel or regarded as a sub-pixel, to generate light of a predetermined wavelength. For example, each light-emitting unit may correspond to one of a red pixel, a green pixel, a blue pixel, a white pixel, or other colors or wavelengths or a combination thereof, but the present disclosure is not limited thereto. FIG. 1 shows that the light-emitting unit 121 may be one of a red pixel, a green pixel, a blue pixel and a white pixel, the light-emitting unit 122 may be one of a red pixel, a green pixel, a blue pixel or a white pixel, and the light-emitting unit 123 may be one of a red pixel, a green pixel, a blue pixel or a white pixel, but the present disclosure is not limited thereto.

After the light-emitting units are mounted to the substrate 110, an adhesive material may be applied to each space which is disposed between each chip and the substrate 110. FIG. 1 shows an example to apply the liquid adhesive material 130 by an inkjet printing method, but the present disclosure is not limited thereto. In a variant embodiment, the method for applying the liquid adhesive material 130 may also include coating, screen printing or other suitable known processes, and the above-mentioned process may be applied to other embodiments of the present disclosure for applying the adhesive material 130 and is not elaborated again. The method proposed in the present disclosure is beneficial to increase the caulking property of the adhesive material 130, and therefore, is beneficial to the robustness between each light-emitting unit and the substrate 110. The adhesive material 130 may be a resin with high optical transmittance. For example, the optical transmittance of the adhesive material 130 may be greater than or equal to 95% (optical transmittance ≥95%), but the present disclosure is not limited thereto. In other words, the optical transmittance of the adhesive material 130 for light with a wavelength of 380 nm to 780 nm is greater than or equal to 95%. Alternatively, the optical transmittance of the adhesive material 130 for light with a wavelength of 550 nm is greater than or equal to 95%. The adhesive material 130 may be a material such as acrylic, silicone, silicon, or epoxy resin, but the present disclosure is not limited thereto. The adhesive material 130 may have a suitable viscosity at room temperature, for example, in a range between 1 cP and 500 cP, in a range between 1 cP and 100 cP, or in a range between 1 cP and 50 cP, but the present disclosure is not limited thereto. The adhesive material 130 may have a viscosity which is thermally changeable. For example, upon heating the viscosity of the adhesive material 130 may be adjusted to, such as between 8 cP and 12 cP. The adjustment of the viscosity of the adhesive material 130 may match the size of the nozzle 141 of the inkjet machine 140, to appropriately apply the adhesive material 130 to each space disposed between each chip and the substrate 110. The droplet size of the droplet-shaped adhesive material 130 may be less than or equal to 30 micrometers (≤30 μm).

Figure 2:
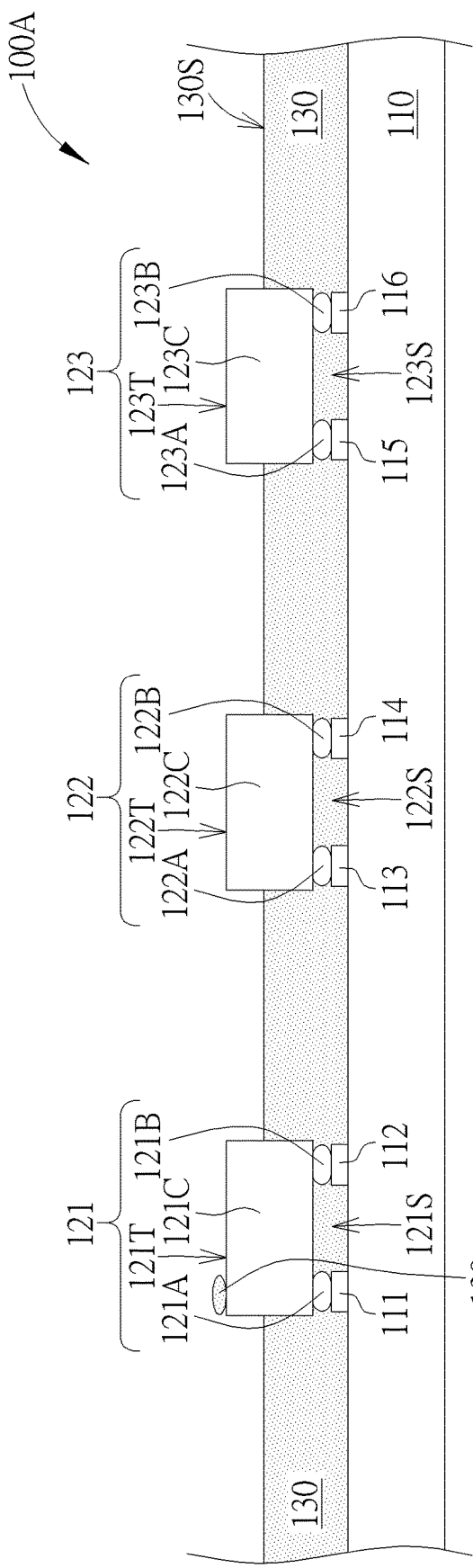

Since the adhesive material 130 may be a liquid of an appropriate viscosity, the droplet-shaped adhesive material 130 may slowly fill the space 121S, the space 122S and the space 123S by natural capillary phenomenon or gravity after the adhesive material 130 is applied by the inkjet printing method. For example, the adhesive material 130 may fill up the space 121S, the space 122S and the space 123S. In addition, the adhesive material 130 may also fill the gaps between the light-emitting unit 121, the light-emitting unit 122 and the light-emitting unit 123, or the adhesive material 130 may stay on the top surfaces of the light-emitting units. For example, the adhesive material 130 may stay on the top surface 121T of the light emitting unit 121, the top surface 122T of the light emitting unit 122, or the top surface 123T of the light emitting unit 123. When the adhesive material 130 fills the gaps between adjacent light-emitting units, the top surfaces of the light-emitting units may be higher than the top surface 130S of the adhesive material 130 (shown in FIG. 2). FIG. 2 shows that the adhesive material 130 fills up the spaces between the chips and the substrate 110, and fills the gaps between the light-emitting units, and may also stay on the top surfaces of the light-emitting units, for example, stays on the top surface 121T of the light emitting unit 121 in FIG. 2 after the adhesive material is applied by the inkjet printing method. Optionally, an external vacuum or pressure may facilitate the droplet-shaped adhesive material 130 to make the adhesive material 130 fill the spaces and gaps.

Figure 3:
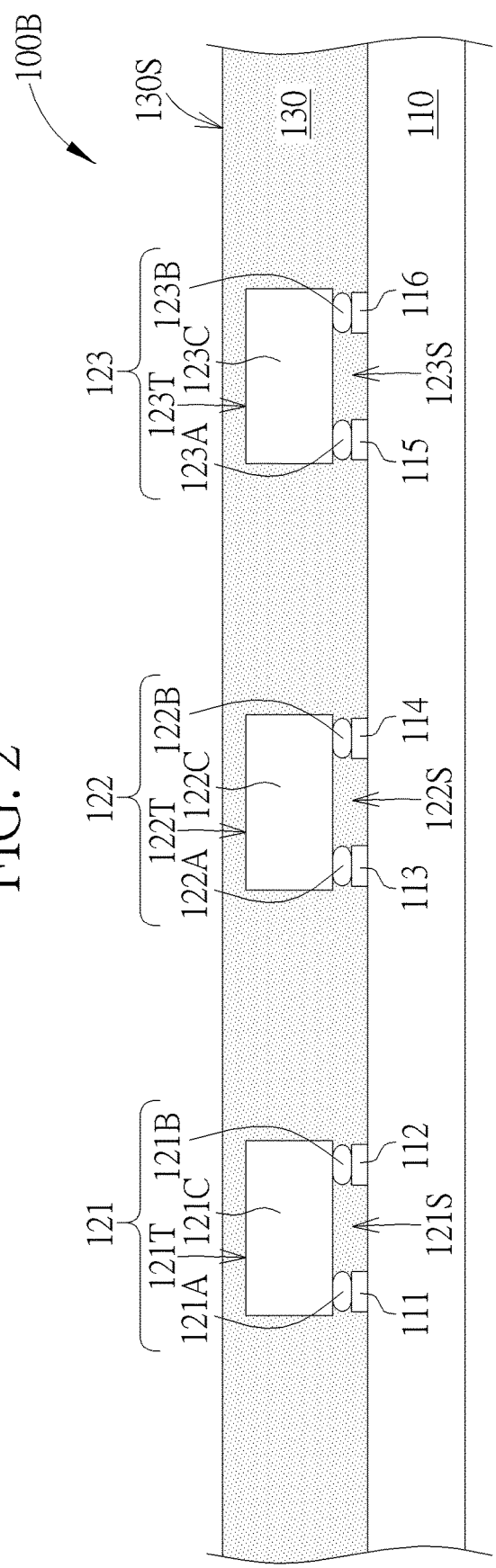

In some embodiments, the adhesive material 130 may further cover the top surfaces of the light-emitting units. FIG. 3 illustrates the application of a sufficient amount of the adhesive material by inkjet printing method to make the adhesive material fill the spaces between the chips and the substrate 110, fill the gaps between the light-emitting units, and also cover the top surfaces of the light-emitting units, so it may be regarded as a packaging structure. For example, the nozzle 141 of the inkjet machine 140 shown in FIG. 1 may be controlled to apply the amount of the adhesive material 130 so that the adhesive material 130 may fill up the space 121S, the space 122S and the space 123S, and may fill the gaps between the light-emitting unit 121, the light emitting unit 122 and the light emitting unit 123 and further cover the top surface 121T of the light emitting unit 121, the top surface 122T of the light emitting unit 122, or the top surface 123T of the light emitting unit 123. In some embodiments, the top surface 130S of the adhesive material 130 may be higher than the top surfaces of the light emitting units. Since the top surfaces of the light-emitting units may generally be regarded as the light-emitting surfaces, in order to reduce the light loss caused by the adhesive material 130 covering the top surfaces, it is preferable to select an adhesive material of a light transmittance greater than or equal to 95% in this embodiment, but the present disclosure is not limited thereto. If a smaller amount of adhesive material is applied by the inkjet printing method, it corresponds to the embodiment as shown in FIG. 2.

Figure 4:
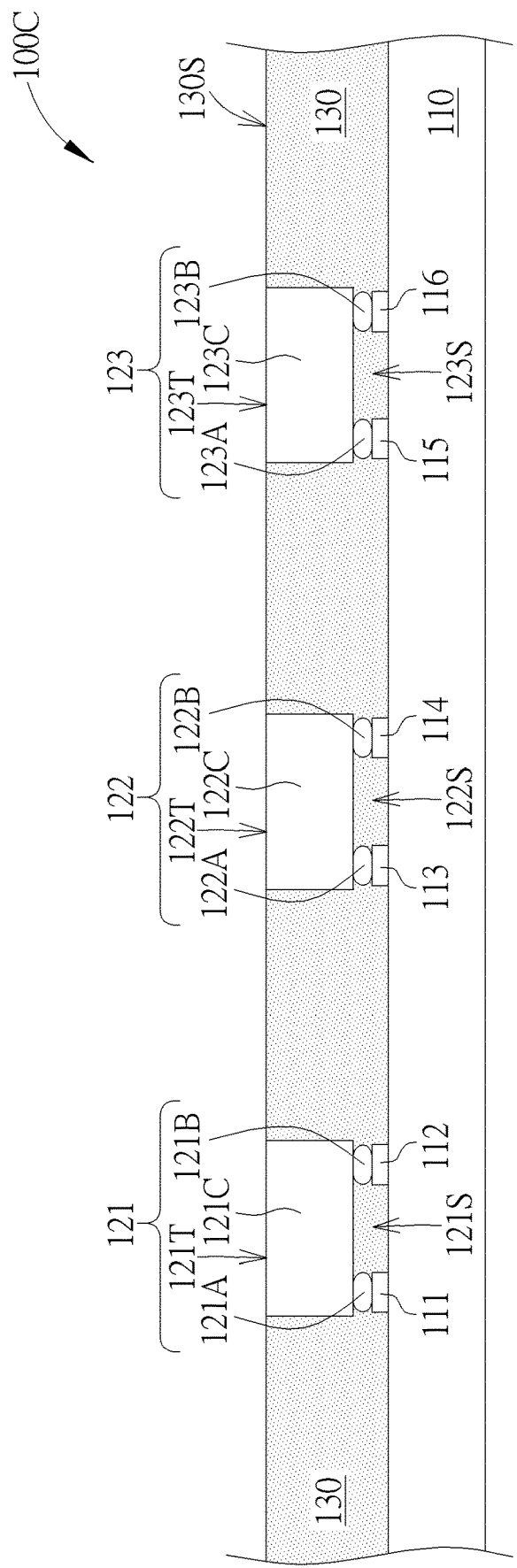

In some embodiments, if the adhesive material 130 covers the top surface of the light-emitting units, a post process may be optionally carried out. FIG. 4 shows a structure after the post process. The top surface 130S of the adhesive material 130 is as high as the top surfaces of the light-emitting units to form a coplanar structure. The optional post process may be a surface leveling method. The optional post process, such as chemical etching, mechanical polishing, or plasma treatment, may be carried out to lower the top surface 130S of the adhesive material 130 so that the top surface 130S of the adhesive material 130 may be roughly (or substantially) close to the top surfaces of the light-emitting units, or make the top surface 130S of the adhesive material 130 as high as the top surfaces of the light-emitting units, to become a coplanar structure, and to expose the top surface 121T of the light-emitting unit 121, to expose the top surface 122T of the light-emitting unit 122, or to expose the top surface 123T of the light emitting unit 123.

In some embodiments, the curing step of the adhesive material 130 may also be carried out. An appropriate curing step may be carried out by referring to the curing conditions of various adhesive materials 130, such as radiation, heating, or a mixture of the two, so that the cured adhesive material 130 may make the light-emitting units fixed on the substrate to reinforce the bonding strength between the light-emitting units and the substrate. FIG. 2 illustrates that the display device 100A includes a cured adhesive material 130, and the top surface 130S may be lower than the top surfaces of the light emitting units. FIG. 3 illustrates that the display device 100B includes a cured adhesive material 130, and the top surface 130S may be higher than the top surfaces of the light emitting units. FIG. 4 illustrates that the display device 100C includes the cured adhesive material 130, and the top surface 130S along with the top surfaces of the light-emitting units forms a coplanar structure.

Figure 3A:
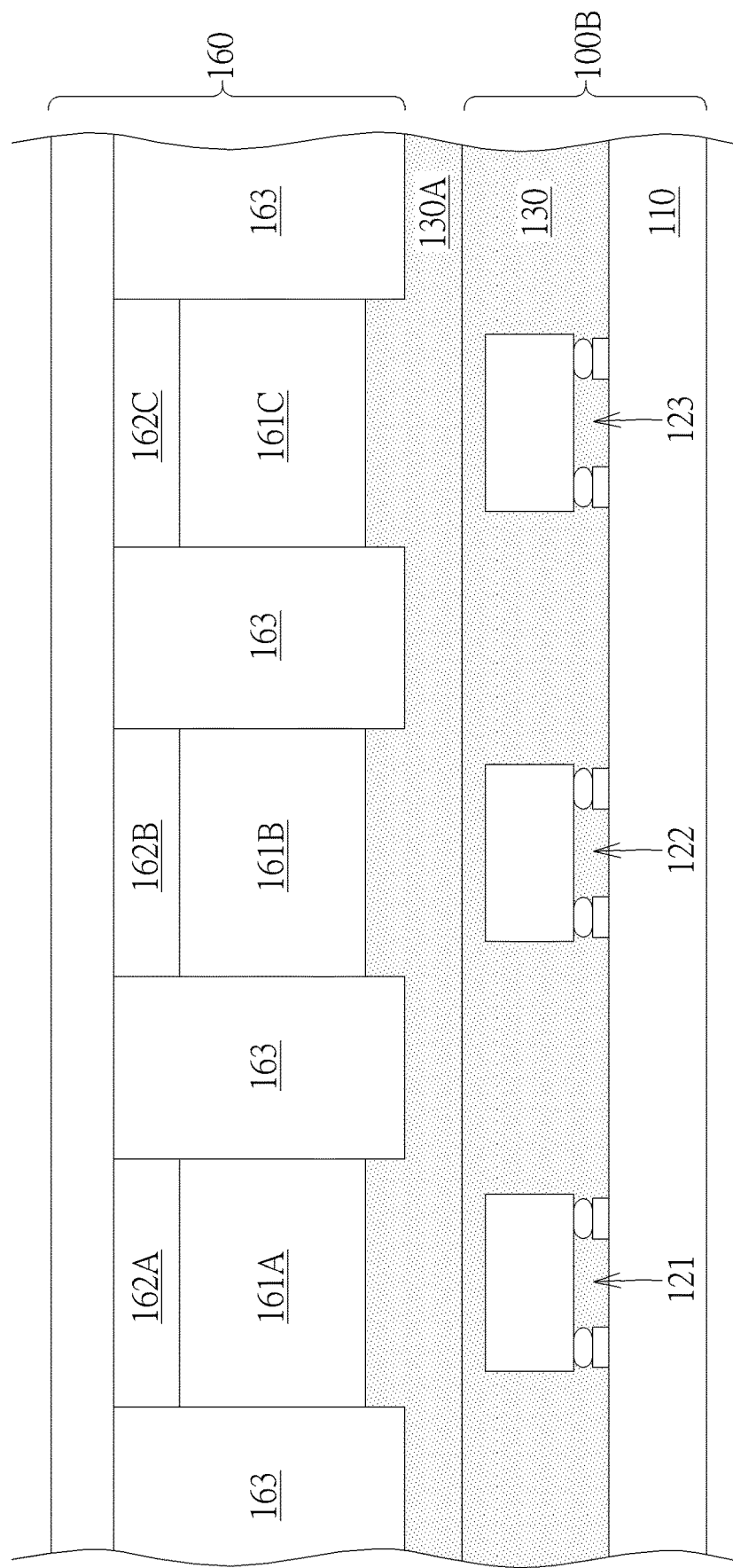
FIG. 3A is a schematic flowchart corresponding to FIG. 3 of a method for manufacturing a display device according to the present disclosure, which shows a schematic cross-sectional view of the display device.

FIG. 3A is a schematic flowchart corresponding to FIG. 3 of a method for manufacturing a display device according to the present disclosure, which shows a schematic cross-sectional view of the display device. Furthermore, another optional adhesive material 130A, such as an optical clear resin (OCR), may be used to bond the display device 100B to another optical substrate 160 after the curing step of the adhesive material 130. The optical substrate 160 may include a color conversion layer, a color filter layer, and a bank 163, but the present disclosure is not limited thereto. FIG. 3A shows that the light conversion layer may include a light conversion layer 161A, a light conversion layer 161B and a light conversion layer 161C. The color filter layer may include a color filter layer 162A, a color filter layer 162B and a color filter layer 162C, but the present disclosure is not limited thereto. The light conversion layer 161A and the color filter layer 162A may correspond to the light emitting unit 121, the light conversion layer 161B and the color filter layer 162B may correspond to the light emitting unit 122, and the light conversion layer 161C and the color filter layer 162C may correspond to the light emitting unit 123. The light conversion layer may convert blue light to green light or to red light through the light conversion particles therein, such as quantum dot particles (QD particles) when the light emitting unit 121, the light-emitting unit 122 and the light-emitting unit 123 are blue pixels which emits blue light, but the present disclosure is not limited thereto.

FIG. 5 to FIG. 8 are schematic flowcharts of the second embodiment of the method for manufacturing a display device according to the present disclosure, which show schematic cross-sectional views of the display device. In the second embodiment of the method for manufacturing a display device of the present disclosure, a pixel definition layer (PDL) may be further provided between adjacent light-emitting units.

Figure 5:
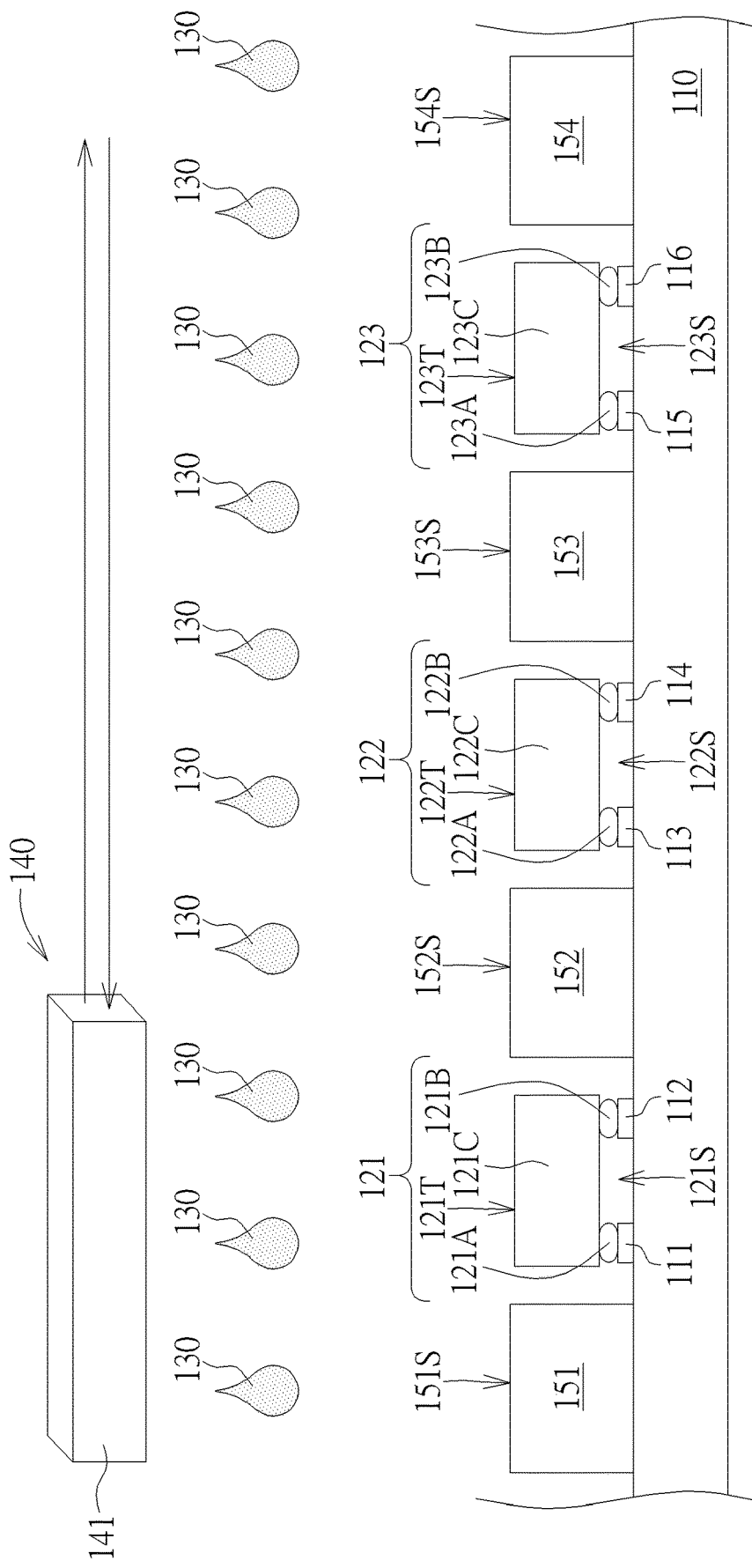

First, as shown in FIG. 5, a substrate 110 is provided. The substrate 110 may include a bonding pad 111, a bonding pad 112, a bonding pad 113, a bonding pad 114, a bonding pad 115, and a bonding pad 116. The substrate 110 may be a transparent or opaque organic material or inorganic material, or the substrate 110 may be a rigid material or a flexible material. Please refer to the first embodiment for the details of the substrate 110, so they are not elaborated again. Second, a plurality of light emitting units are provided, such as a light emitting unit 121, a light emitting unit 122, and a light emitting unit 123. Each light-emitting unit may have a chip and at least one bonding pin. For example, the light-emitting unit 121 may have a chip 121C and two bonding pins such as a bonding pin 121A/a bonding pin 121B, the light-emitting unit 122 may have a chip 122C and two bonding pins such as a bonding pin 122A/a bonding pin 122B), the light-emitting unit 123 may have a chip 123C and two bonding pins such as a bonding pin 123A/a bonding pin 123B, but the present disclosure is not limited thereto. Each of the plurality of light emitting units may be mounted to the substrate 110 through the bonding pin(s). For example, the light emitting unit 121 may be respectively mounted to the corresponding bonding pad 111/bonding pad 112 of the substrate 110 through the bonding pin 121A/bonding pin 121B; the light emitting unit 122 may be respectively mounted to the corresponding bonding pad 113/bonding pad 114 of the substrate 110 through the bonding pin 122A/bonding pin 122B; the light emitting unit 123 may be respectively mounted to the corresponding bonding pad 115/bonding pad 116 of the substrate 110 through the bonding pin 123A/bonding pin 123B, but the present disclosure is not limited thereto. Between each chip and the substrate 110 there may be a space, such as a space 121S between the chip 121C and the substrate 110, a space 122S between the chip 122C and the substrate 110 or a space 123S between the chip 123C and the substrate 110, but the present disclosure is not limited thereto. Please refer to the first embodiment for the details of the light-emitting unit, so they are not elaborated again.

Between adjacent light-emitting units, a pixel defining layer may be further included. For example, the pixel defining layer 151 may be located on one side of the light emitting unit 121; the pixel defining layer 152 may be located between the light emitting unit 121 and the light emitting unit 122; the pixel defining layer 153 may be located between the light emitting unit 122 and the light emitting unit 123; the pixel defining layer 154 may be located beside the light emitting unit 123. Each pixel defining layer, such as the pixel defining layer 151, the pixel defining layer 152, the pixel defining layer 153 and the pixel defining layer 154, may include various organic or inorganic materials. The pixel defining layer may be a transparent pixel defining layer if no pigment particles are added. Conversely, it may be a colored pixel defining layer, such as a white pixel defining layer or a gray pixel defining layer if pigment particles are added to the pixel defining layer. Each pixel defining layer may be located on the substrate 110 or in direct contact with the substrate 110, but the present disclosure is not limited thereto. The top surfaces of the pixel defining layers may not be lower than the top surfaces of the light emitting units. For example, the top surface 151S of the pixel defining layer 151, the top surface 152S of the pixel defining layer 152, the top surface 153S of the pixel defining layer 153 and the top surface 154S of the pixel defining layer 154 may not be lower than the top surface 121T of the light emitting unit 121, the top surface 122T of the light emitting unit 122 or the top surface 123T of the light emitting unit 123, but the present disclosure is not limited thereto. The pixel defining layers may be used for light shielding, reducing the possibility of light mixing of adjacent light-emitting units to affect the image quality of the display device. The pixel defining layer may also be used for reflection to improve the light utilization efficiency of the light emitting units. In some embodiments, the gaps between the pixel defining layers and the adjacent light-emitting units may not be large, for example, less than 10 micrometers (<10 μm), but the present disclosure is not limited thereto. A relatively smaller gap between the pixel defining layer and the adjacent light-emitting unit may affect the caulking property of the adhesive material. If the caulking property of the adhesive material is poor, it may be detrimental to the robustness between the light-emitting units and the substrate.

Then, an adhesive material 130 may be applied to the spaces and gaps between the chips, the pixel defining layers and the substrate 110. FIG. 5 illustrates the application of the liquid adhesive material by an inkjet printing method, but the present disclosure is not limited thereto. The method proposed in the present disclosure is beneficial to increase the caulking property of the adhesive material so as to be beneficial to the robustness between the micro light-emitting units and the substrate. The adhesive material 130 may be a resin with high optical transmittance. For example, the optical transmittance of the adhesive material 130 may be greater than or equal to 95% (optical transmittance ≥95%), but the present disclosure is not limited thereto. The adhesive material 130 may be a material such as acrylic, silicone, silicon, or epoxy resin, but the present disclosure is not limited thereto. The adhesive material 130 may have a suitable viscosity at room temperature, for example, in a range between 1 cP and 500 cP, in a range between 1 cP and 100 cP, or in a range between 1 cP and 50 cP, but the present disclosure is not limited thereto. The adhesive material 130 may have a viscosity which is thermally changeable. For example, upon heating the viscosity of the adhesive material 130 may be adjusted to, such as a range between 8 cP and 12 cP. The adjustment of the viscosity of the adhesive material 130 may match the size of the nozzle 141 of the inkjet machine 140, to appropriately apply the adhesive material 130 to each space and to each gap disposed between each chip, the pixel defining layers and the substrate 110. The droplet size of the droplet-shaped adhesive material 130 may be less than or equal to 30 micrometers (≤30 μm).

Figure 6:
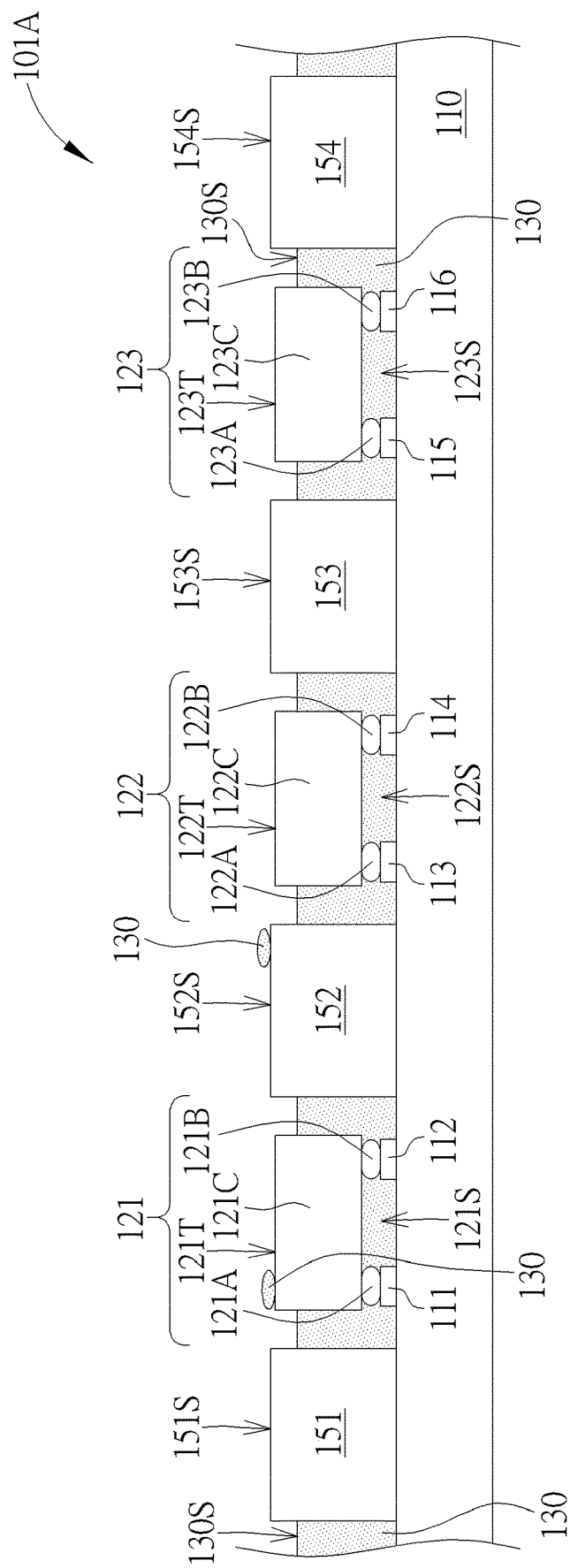

Since the adhesive material 130 may be a liquid of an appropriate viscosity, the adhesive material 130 may slowly fill the space 121S, the space 122S and the space 123S by natural capillary phenomenon or gravity after the adhesive material 130 is applied by the inkjet printing method. For example, the adhesive material 130 may fill up the space 121S, the space 122S and the space 123S. In addition, the adhesive material 130 may also fill the gaps between the light-emitting units and the pixel defining layers, or the adhesive material 130 may stay on the top surfaces of the light-emitting units. For example, the adhesive material 130 may stay on the top surface 121T of the light emitting unit 121, on the top surface 122T of the light emitting unit 122, or on the top surface 123T of the light emitting unit 123. The adhesive material 130 may also stay on the top surfaces of the pixel defining layers. For example, the adhesive material 130 may stay on the top surface 151S of the pixel defining layer 151, on the top surface 152S of the pixel defining layer 152, and on the top surface 153S of the pixel defining layer 153 or on the top surface 154S of the pixel defining layer 154. In some embodiments, the top surfaces of the light-emitting units may be higher than the top surface 130S of the adhesive material 130 (shown in FIG. 2). FIG. 6 shows that the adhesive material 130 fills up the spaces, and fills in the gaps between the light-emitting units and the pixel defining layers, and may also stay on the top surface 121T of the light emitting unit 121 and on the top surface 152S of the pixel defining layer 152, but the present disclosure is not limited thereto. Optionally, an external vacuum or pressure may facilitate the adhesive material 130 to make the adhesive material 130 fill the spaces and gaps better.

In some embodiments, the adhesive material 130 may further cover the top surfaces of the light-emitting units. FIG. 7 illustrates the application of a sufficient amount of the adhesive material by inkjet printing method to make the adhesive material fill the spaces, fill the gaps between the light-emitting units and the pixel defining layers, and cover the top surfaces of the light-emitting units, so it may be regarded as a packaging structure. For example, the nozzle 141 of the inkjet machine 140 may be controlled to apply the amount of the adhesive material 130 so that the adhesive material 130 may fill up the space 121S, the space 122S and the space 123S, and may fill the gaps between the light-emitting units and the pixel defining layers, and further cover the top surface 121T of the light emitting unit 121, the top surface 122T of the light emitting unit 122, or the top surface 123T of the light emitting unit 123. The adhesive material 130 may also cover the top surface 151S of the pixel defining layer 151, the top surface 152S of the pixel defining layer 152, the top surface 153S of the pixel defining layer 153 or the top surface 154S of the pixel defining layer 154. After the adhesive material 130 fills the gaps, the top surface 130S of the adhesive material 130 may be higher than the top surfaces of the light-emitting units or higher than the top surface of the pixel defining layer 153. Since the top surfaces of the light-emitting units may generally be regarded as light-emitting surfaces, in order to reduce the light loss caused by the adhesive material 130 covering the top surfaces, it is preferable to select an adhesive material of a light transmittance greater than or equal to 95% in this embodiment, but the present disclosure is not limited thereto. If a smaller amount of adhesive material is applied by the inkjet printing method, it corresponds to the embodiment as shown in FIG. 6. Optionally, an external vacuum or pressure may facilitate the adhesive material 130 to make the adhesive material 130 fill the spaces and gaps better.

In some embodiments, if the adhesive material 130 covers the top surfaces of the light-emitting units, a post process may be optionally carried out. FIG. 8 shows a structure after the post process. The top surface 130S of the adhesive material 130 is as high as the top surfaces of the light-emitting units to form a coplanar structure. The optional post process may be a surface leveling method. The optional post process, such as chemical etching, mechanical polishing, or plasma treatment, may be carried out to lower the top surface 130S of the adhesive material 130 so that the top surface 130S of the adhesive material 130 may be roughly (or substantially) close to the top surfaces of the light-emitting units, or make the top surface 130S of the adhesive material 130 as high as the top surfaces of the light-emitting units, to become a coplanar structure, and to expose the top surface 121T of the light-emitting unit 121, expose the top surface 122T of the light-emitting unit 122 or expose the top surface 123T of the light emitting unit 123. In some embodiments, the top surface 151S of the pixel defining layer 151, the top surface 152S of the pixel defining layer 152, the top surface 153S of the pixel defining layer 153 or the top surface 154S of the pixel defining layer 154 may be exposed as well.

In some embodiments, the curing step of the adhesive material 130 may also be carried out. An appropriate curing step may be carried out by referring to the curing conditions of various adhesive materials 130, such as radiation, heating, or a mixture of the two, so that the cured adhesive material 130 may make the light-emitting units fixed on the substrate to reinforce the bonding strength between the light-emitting units and the substrate. FIG. 6 illustrates that the display device 101A includes a cured adhesive material 130, and the top surface 130S may be lower than the top surfaces of the light emitting units. FIG. 7 illustrates that the display device 101B includes a cured adhesive material 130, and the top surface 130S may be higher than the top surfaces of the light emitting units. FIG. 8 illustrates that the display device 101C includes the cured adhesive material 130, and the top surface 130S along with the top surfaces of the light-emitting units forms a coplanar structure.

Figure 9:
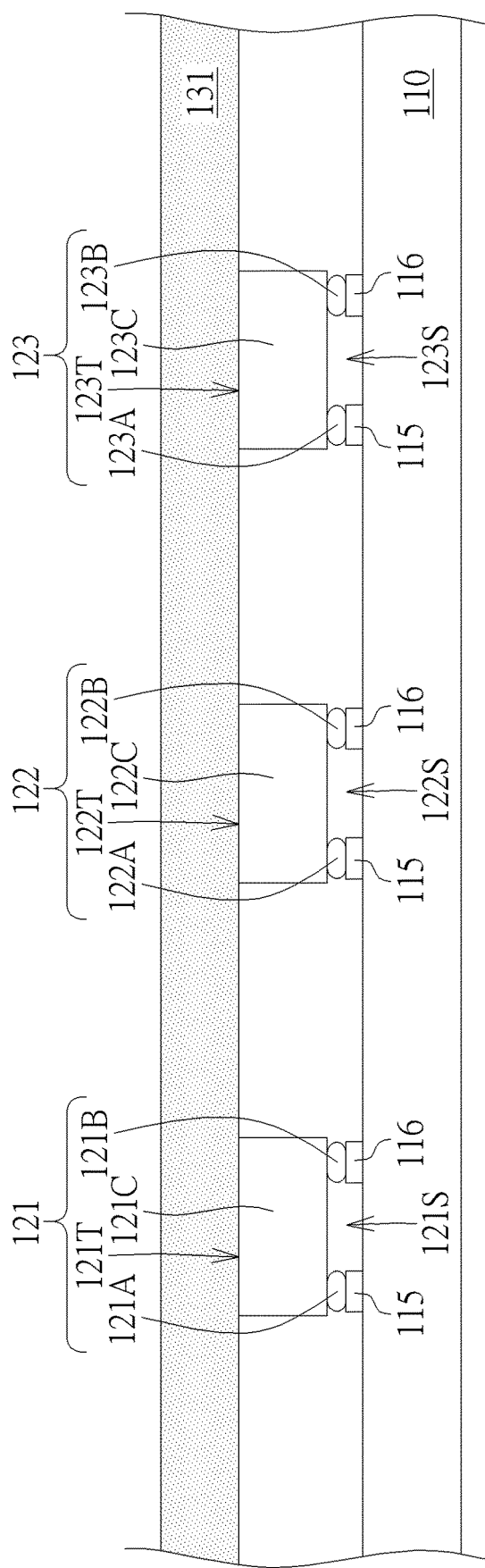
FIG. 9 to FIG. 10 are schematic flowcharts of the third embodiment of the method for manufacturing a display device according to the present disclosure, which show schematic cross-sectional views of the display device.
Figure 10:
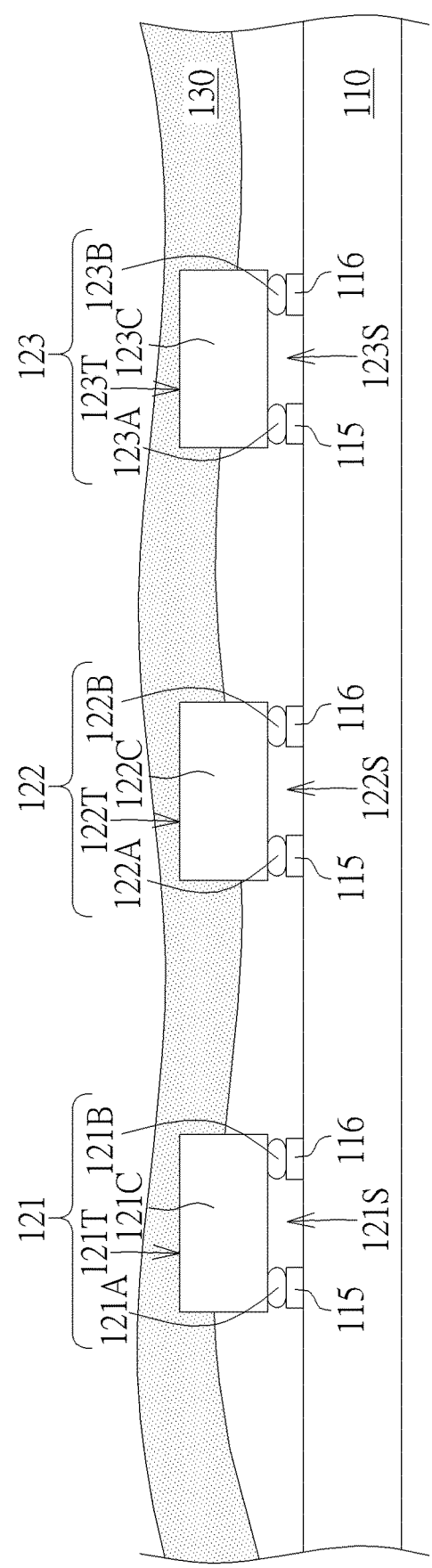

FIG. 9 to FIG. 10 are schematic flowcharts of the third embodiment of the method for manufacturing a display device according to the present disclosure, which show schematic cross-sectional views of the display device. In the third embodiment of the method for manufacturing a display device according to the present disclosure, the application of the adhesive material may involve a sheet of the adhesive material in a solid state.

FIG. 9 shows an example to apply the adhesive material in a form a sheet in a solid state, but the present disclosure is not limited thereto. The method proposed in the present disclosure is beneficial to increase the caulking property of the adhesive material, and therefore, is beneficial to the robustness between each light-emitting units and the substrate. For example, an adhesive material in a solid state is provided, and a sheet of the solid adhesive material is attached to a plurality of light-emitting units. The sheet 131 may be an optical transparent adhesive, such as optically clear adhesive (OCA), but the present disclosure is not limited thereto. The optical transmittance of the sheet 131 may be greater than or equal to 95% (optical transmittance ≥95%), but the present disclosure is not limited thereto. In some embodiments, the thickness of the sheet 131 may be less than 10 micrometers (<10 µm). The sheet 131 may be in a solid state at room temperature, but the present disclosure is not limited thereto. The sheet 131 may be softened and have a suitable viscosity upon heating to convert the sheet 131 from a solid state to a liquid state. For example, the solid sheet 131 may be softened to become a liquid adhesive material 130 after the heating step to adjust the viscosity to, such as a range between 8 cP and 12 cP.

Since the adhesive material 130 may be a liquid of an appropriate viscosity, the adhesive material 130 may slowly fill the spaces between the chips and the substrate after the softened sheet 131 becomes the liquid adhesive material 130. For example, the adhesive material 130 may slowly fill into and fill up the space 121S, the space 122S and the space 123S by natural capillary phenomenon or gravity. In addition, the adhesive material 130 may also fill the gaps between the light-emitting unit 121, the light-emitting unit 122 and the light-emitting unit 123, or the adhesive material 130 may stay on the top surfaces of the light-emitting units. For example, the adhesive material 130 may stay on the top surface 121T of the light emitting unit 121, on the top surface 122T of the light emitting unit 122, or on the top surface 123T of the light emitting unit 123. The top surfaces of the light-emitting units may be higher than the top surface 130S of the adhesive material 130 (shown in FIG. 2).

In some embodiments, the adhesive material 130 may further cover the top surfaces of the light-emitting units. As shown in FIG. 3, the adhesive material may fill the spaces, fill the gaps between the light-emitting units, and further cover the top surfaces of the light-emitting units. The amount of the adhesive material 130 may be controlled so that the adhesive material 130 may fill up the space 121S, the space 122S and the space 123S, and may fill the gaps between the light-emitting unit 121, the light emitting unit 122 and the light emitting unit 123 and further cover the top surface 121T of the light emitting unit 121, the top surface 122T of the light emitting unit 122 or the top surface 123T of the light emitting unit 123. The top surface 130S of the adhesive material 130 may be higher than the top surfaces of the light emitting units after the adhesive material 130 fills the spaces and the gaps. Optionally, an external vacuum or pressure may facilitate the liquid adhesive material 130 to make the adhesive material 130 fill the spaces and gaps better.

In another embodiment of the present disclosure, a post process may be optionally carried out if the adhesive material 130 covers the top surfaces of the light-emitting units. FIG. 4 shows that the top surface 130S of the adhesive material 130 is as high as the top surface of the light-emitting unit to form a coplanar structure after the post process. The optional post process may be a surface leveling method. Please refer to FIG. 4 for the details of the post process, so they are not elaborated again.

In some embodiments, the curing step of the adhesive material 130 may also be carried out. An appropriate curing step may be carried out by referring to the curing conditions of various adhesive materials 130, such as radiation, heating, or a mixture of the two, so that the cured adhesive material 130 may make the light-emitting units fixed on the substrate to reinforce the bonding strength between the light-emitting units and the substrate. Please refer to FIG. 2, FIG. 3 or FIG. 4 for the details, so they are not elaborated again.

Figure 11:
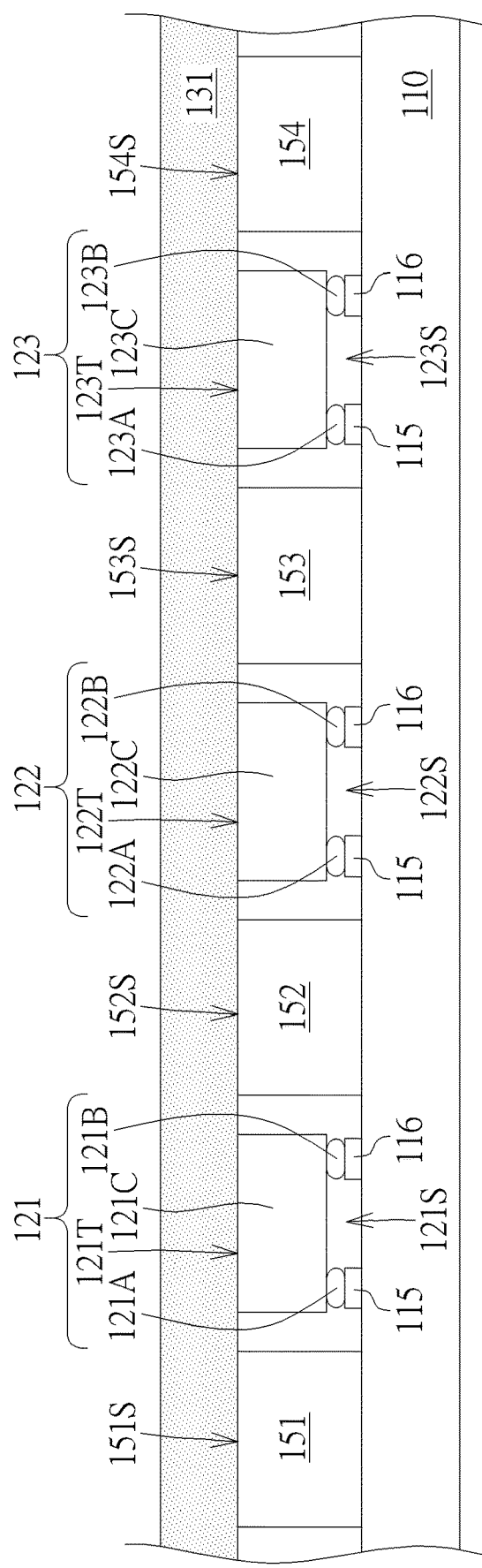
FIG. 11 to FIG. 12 are schematic flowcharts of the fourth embodiment of the method for manufacturing a display device according to the present disclosure, which show schematic cross-sectional views of the display device.
Figure 12:
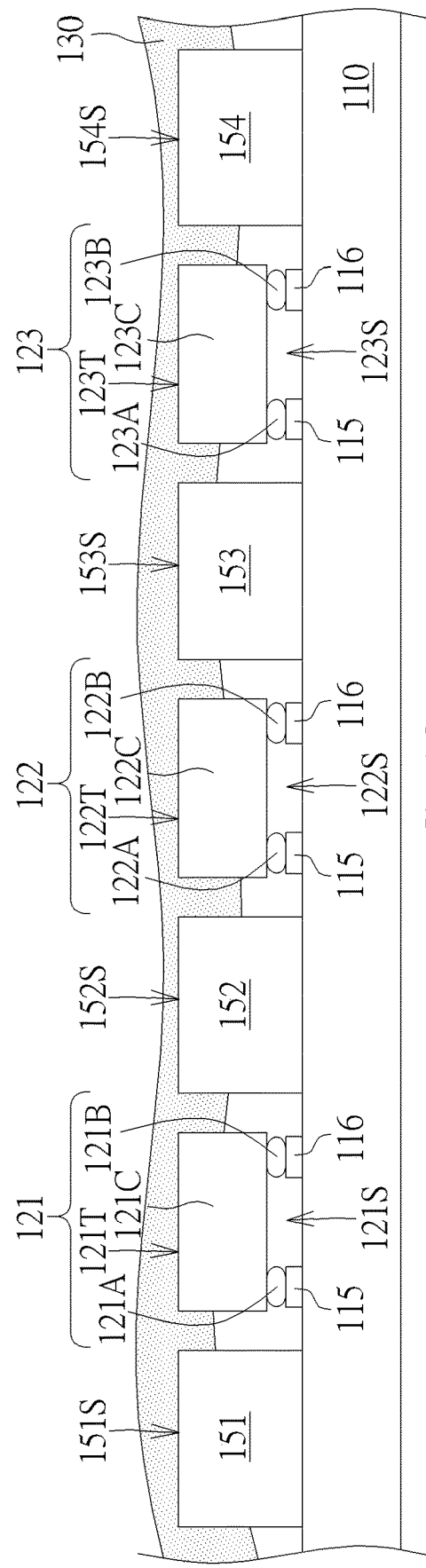

FIG. 11 to FIG. 12 are schematic flowcharts of the fourth embodiment of the method for manufacturing a display device according to the present disclosure, which show schematic cross-sectional views of the display device. In the fourth embodiment of the method for manufacturing a display device of the present disclosure, the method of applying the adhesive material may involve a sheet of an adhesive material in a solid state on the substrate including the pixel defining layer.

FIG. 11 shows the adhesive material is applied in a form a sheet in a solid state, but the present disclosure is not limited thereto. The method proposed in the present disclosure is beneficial to increase the caulking property of the adhesive material, and therefore, is beneficial to the robustness between each light-emitting unit and the substrate. For example, an adhesive material in a solid state is provided, and a sheet of the solid adhesive material is attached to a plurality of light-emitting units. The sheet 131 may be an optical adhesive, such as optically clear adhesive (OCA). Please refer to the above descriptions for the details of the sheet 131, so they are not elaborated again.

Since the adhesive material 130 may be a liquid of an appropriate viscosity, the adhesive material 130 may flow into the spaces between the chips and the substrate after the softened sheet 131 becomes the liquid adhesive material 130. For example, the adhesive material 130 may slowly fill into and fill up the space 121S, the space 122S and the space 123S by natural capillary phenomenon or gravity. In addition, the adhesive material 130 may also fill the gaps between the light-emitting units and the pixel defining layers, or the adhesive material 130 may stay on the top surfaces of the light-emitting units. For example, the adhesive material 130 may stay on the top surface 121T of the light emitting unit 121, on the top surface 122T of the light emitting unit 122 or on the top surface 123T of the light emitting unit 123. The adhesive material 130 may also stay on the top surfaces of the pixel defining layers. For example, the adhesive material 130 may stay on the top surface 151S of the pixel defining layer 151, on the top surface 152S of the pixel defining layer 152 and on the surface 153S of the pixel defining layer 153 or on the top surface 154S of the pixel defining layer 154. The top surfaces of the light-emitting units may be higher than the top surface 130S of the adhesive material 130 (shown in FIG. 2) after the adhesive material 130 fills the gaps between adjacent light-emitting units.

In some embodiments, the adhesive material 130 may further cover the top surfaces of the light-emitting units. FIG. 7 illustrates that the adhesive material fills the spaces, fills the gaps between the light-emitting units, and covers the top surfaces of the light-emitting units. In some embodiments, a post process may be optionally carried out if the adhesive material 130 covers the top surfaces of the light-emitting units. FIG. 8 shows that the top surface 130S of the adhesive material 130 is as high as the top surfaces of the light-emitting units to form a coplanar structure after the post process. The optional post process may be a surface leveling method. Please refer to FIG. 8 for the details of the post process, so they are not elaborated again.

In some embodiments, a curing step of the adhesive material 130 may be further carried out. An appropriate curing step may be carried out by referring to the curing conditions of various adhesive materials 130, such as radiation, heating, or a mixture of the two, so that the cured adhesive material 130 may make the light-emitting units fixed on the substrate to reinforce the bonding strength between the light-emitting units and the substrate. Please refer to FIG. 6, FIG. 7 or FIG. 8 for the details, so they are not elaborated again.

Figure 13:
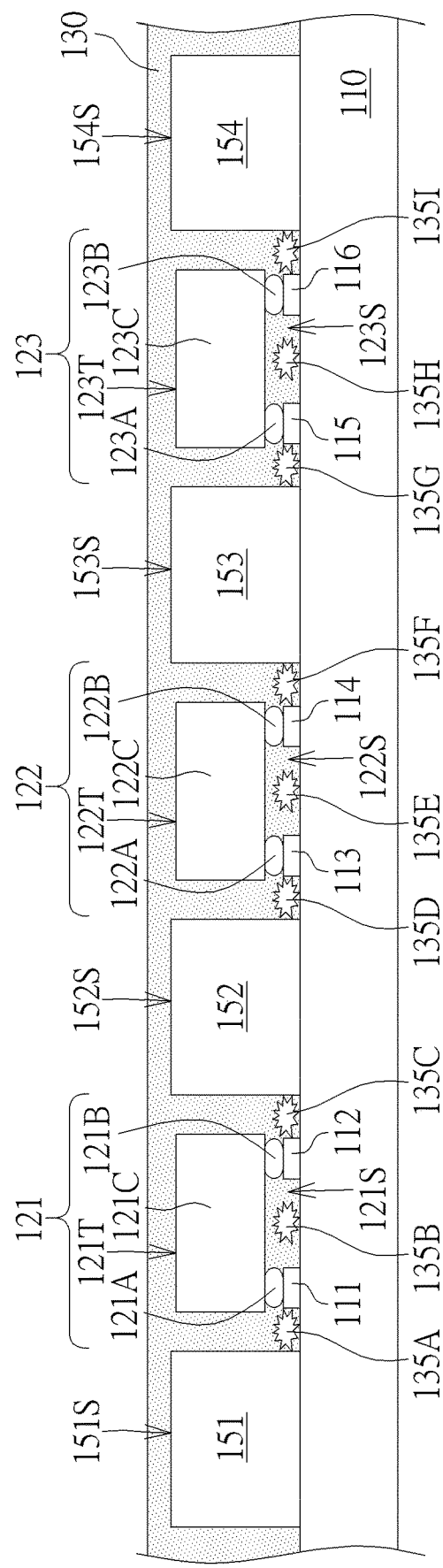
FIG. 13 is a schematic flowchart of the fifth embodiment of a method for manufacturing a display device according to the present disclosure, which shows a schematic cross-sectional view of the display device.

FIG. 13 is a schematic flowchart of the fifth embodiment of a method for manufacturing a display device according to the present disclosure, which shows a schematic cross-sectional view of the display device. In the fifth embodiment of the method of manufacturing a display device of the present disclosure, the method of applying the adhesive material may involve a sheet of a solid adhesive material or a liquid adhesive material.

The adhesive material 130 may slowly fill the space 121S, the space 122S, and the space 123S after the adhesive material 130 is applied. For example, the adhesive material 130 may fill up the space 121S, the space 122S, and the space 123S. In addition, the adhesive material 130 may further fill the gaps between the light emitting units and the pixel defining layers. For example, the adhesive material 130 may fill the gap between the pixel defining layer 152 and the light emitting unit 121, the adhesive material 130 may fill the gap between the pixel defining layer 152 and the light emitting unit 122, the adhesive material 130 may fill the gap between the pixel defining layer 153 and the light emitting unit 122, the adhesive material 130 may fill the gap between the pixel defining layer 153 and the light emitting unit 123, and the adhesive material 130 may fill the gap between the pixel defining layer 154 and the light emitting unit 123.

Next, the adhesive material 130 may be cured. Different from the aforementioned curing of the adhesive material 130, the adhesive material 130 may be cured from the other side of the substrate 110 (the side opposite to the light-emitting units) in this embodiment. The method of locally curing the adhesive material 130 may use a laser to focus on certain parts of the adhesive material 130, or a local curing device to locally cure certain parts of the adhesive material 130. For example, a laser may be used to focus on the part 135A, the part 135B, the part 135C, the part 135D, the part 135E, the part 135F, the part 135G, the part 135H and the part 135I of the adhesive material 130 so that these parts of the adhesive material 130 are cured, but other parts of the adhesive material 130 are not cured or not completely cured, to become a selectively cured adhesive material 130 which is different from the above-mentioned adhesive material 130.

The uncured adhesive material 130 or the incompletely cured adhesive material 130 may be removed after the selective curing of the adhesive material 130. The method to remove the uncured adhesive material 130 may be: entirely cleaning the selectively cured adhesive material 130 or immersing the selectively cured adhesive material 130 in a solvent, but the present disclosure is not limited thereto.

A display device of this embodiment may be obtained after removing the uncured adhesive material 130. The display device of this embodiment includes a locally cured portion of the adhesive material. This locally cured portion of the adhesive material, such as the part 135A, the part 135B, the part 135C, the part 135D, the part 135E, the part 135F, the part 135G, the part 135H or the part 135I, may be selectively located in the space 121S, selectively located in the space 122S or selectively located in the space 123S, but the present disclosure is not limited thereto. In addition, the locally cured portion of the adhesive material may also be selectively located in the gaps between the light-emitting units and the pixel defining layers, for example, selectively located between the pixel defining layer 152 and the light-emitting unit 121, selectively located between the pixel defining layer 152 and the light emitting unit 122, selectively located between the pixel defining layer 153 and the light emitting unit 122, selectively located between the pixel defining layer 153 and the light-emitting unit 123 or selectively located between the pixel defining layer 154 and the light-emitting unit 123, but the present disclosure is not limited thereto. The differences between the display device of this embodiment and the display device 100A shown in FIG. 2 or the display device 101A shown in FIG. 6 reside in that there may be no adhesive material 130 remaining on the top surfaces of the light-emitting units or the adhesive material 130 may not stay on the top surfaces of the pixel defining layers although the top surface 130S of the cured adhesive material 130 may be lower than the top surfaces of the light emitting units.

According to the method of manufacturing the display device of the embodiments of the present disclosure, a display device with enhanced bonding strength of the light-emitting units fixed on the substrate may still be obtained even the distance between the chips of the light-emitting units and the substrate may be less than or equal to 3 micrometers, or the gaps between the pixel defining layers and the adjacent light-emitting units may be less than 10 micrometers by applying the adhesive material in the spaces between the chips and the substrate. This display device may also be directly regarded as a packaging structure. In this way, the quality of the mini light-emitting units in the display devices may be improved to facilitate the technological improvement and innovation of the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method of manufacturing a display device, comprising:
   providing a substrate;
   providing a light emitting unit having a chip and at least one bonding pin;
   mounting the light emitting unit on the substrate through the at least one bonding pin;
   applying an adhesive material to a space between the chip and the substrate after mounting the light emitting unit on the substrate, wherein the adhesive material is applied by:
      attaching a sheet of the adhesive material in a solid state on the light emitting unit and
      converting the sheet from the solid state into a fluid state, thereby flowing into the space between the chip and the substrate; and
   providing an external vacuum to let the adhesive material fill the space.

2. The method according to claim 1, wherein the adhesive material is applied by an ink-jet printing process.

3. The method according to claim 2, wherein the adhesive material has a viscosity in a range from 8 cP to 12 cP.

4. The method according to claim 1, comprising a heating step to convert the sheet of the adhesive material from the solid state into the fluid state.

5. The method according to claim 1, wherein the sheet has a thickness less than 10μm.

* * * * *